(12) United States Patent
Yamaura et al.

(10) Patent No.: US 10,552,573 B2
(45) Date of Patent: Feb. 4, 2020

(54) VEHICLE SIMULATION DEVICE FOR CROWD-SOURCED VEHICLE SIMULATION DATA

(71) Applicant: TOYOTA JIDOSHA KABUSHIKI KAISHA, Toyota-shi, Aichi-ken (JP)

(72) Inventors: Masahiro Yamaura, Cupertino, CA (US); Shinichi Shiraishi, San Jose, CA (US)

(*) Notice: Subject to any disclaimer, the term of this patent is extended or adjusted under 35 U.S.C. 154(b) by 982 days.

(21) Appl. No.: 15/074,842

(22) Filed: Mar. 18, 2016

(65) Prior Publication Data
US 2017/0270236 A1    Sep. 21, 2017

(51) Int. Cl.
G06G 7/48      (2006.01)
G06F 17/50     (2006.01)

(52) U.S. Cl.
CPC .............. *G06F 17/5095* (2013.01)

(58) Field of Classification Search
CPC .............. G06F 17/5009; G06F 17/5095
USPC .............. 703/8
See application file for complete search history.

(56) References Cited

U.S. PATENT DOCUMENTS

| | | | |
|---|---|---|---|
| 2005/0187670 A1* | 8/2005 | Katayama | B60T 8/17551 701/1 |
| 2009/0234552 A1* | 9/2009 | Takeda | B60W 30/16 701/96 |

OTHER PUBLICATIONS

Zanardo et al. (An Integrated Evaluation Approach for Performance and Safety of Autonomous Vehicles, 2 pages. (Year: 2013).*
Koon (Evaluation of Autonomous Ground Vehicle Skills, (12 pages)). (Year: 2006).*
Dempsey et al., "Using Modelica Models for Driver-in-the-loop Simulators," Proceedings of the 9th International Modelica Conference, http://bit.ly/1moZpri, downloaded on Mar. 23, 2016, pp. 571-578.

* cited by examiner

*Primary Examiner* — Andre Pierre Louis
(74) *Attorney, Agent, or Firm* — Burbage Law, P.C.; Jon-Michael Burbage; Elizabeth Ruzich

(57) ABSTRACT

The disclosure includes a system, method and tangible memory operable to cloud-source vehicle simulation data. The method may include developing a vehicle dynamics model and a control software model for a proposed vehicle. The method may include developing a road model for generating a virtual test environment for testing a virtual vehicle simulating the proposed vehicle, the virtual vehicle being built based on the vehicle dynamics model and the control software model. The method may include compiling an executable file based on the vehicle dynamics model, the control model and the road model. The method may include distributing a plurality of copies of the executable file to a plurality of client devices. The method may include receiving a set of vehicle simulation data from the plurality of client devices. The set of vehicle simulation data may describe a performance of the virtual vehicle in the test environment.

21 Claims, 11 Drawing Sheets

135

Lorem ipsum dolor sit amet, consectetur adipiscing elit. Phasellus sed turpis a neque egestas luctus. Pellentesque consequat metus eget efficitur malesuada. Duis sed suscipit augue. Vestibulum mattis tempor risus ut fringilla. Mauris facilisis ligula sed felis pellentesque, at bibendum odio condimentum. Vivamus dapibus vulputate ex eu vulputate. Sed sed erat sit amet justo eleifend tristique. Nam ut commodo felis, non posuere tellus. Praesent auctor placerat nulla, in tempus est luctus eget. Aliquam nec eros ligula. Aliquam sodales velit diam, quis lobortis tellus semper sit amet. Fusce mattis sit amet tortor viverra placerat. Phasellus non lobortis sapien, ut lacinia sem. Pellentesque vehicula mauris sit amet augue dictum, id euismod sapien consequat. In efficitur leo magna.

Accept 625   Revert 630

VEHICLE SIMULATION DEVICE FOR CROWD-SOURCED VEHICLE SIMULATION DATA

BACKGROUND

The specification relates to a vehicle simulation device for cloudsourcing vehicle simulation data.

Vehicles are designed by design engineers. Design engineers use modeling software for design space exploration of their vehicle designs, including simulation of the performance of different design choices and evaluation of different design alternatives. Examples of modeling software suitable for vehicle design include Modelica platforms such as MapleSim.

Design engineers must check their vehicle designs to determine whether they conform to certain hard constraints. A hard constraint for a vehicle design includes a constraint that must always hold for all situations in which the driver is using the vehicle for its intended purpose. For example, so long as the vehicle is being driven on a public road at speeds that conform with legal limits, the drive shaft should not break in two, and the vehicle should continue to go forward while the accelerator is pressed because the drive shaft is intact.

A vehicle design may include Advanced Driver Assistance System ("ADAS") software. ADAS simulation tools, such as PreScan, are widely used to test the correctness of ADAS software in a virtual road environment and vehicle dynamics environment before the ADAS software is deployed in an actual vehicle in the real world. In order to maximize achievement of ADAS simulation, the design engineer needs to create a great number of test scenarios that demonstrate the performance of the vehicle design including the ADAS software and other behaviors of a virtual vehicle representing the vehicle design in a virtual test environment. The process of manually generating test scenarios in the virtual test environment is time consuming; many instances of simulated scenarios are needed to comply with best practices.

SUMMARY

Embodiments may include a method, system or non-transitory computer readable operable to obtain vehicle simulation data for a proposed vehicle from a plurality of client devices. The plurality of client devices may test a virtual vehicle simulating the proposed vehicle. Some of the plurality of client devices may test the virtual vehicle contemporaneously in a virtual test environment that was designed by the developers of proposed vehicle for testing the virtual vehicle. For example, one hundred client devices may test a plurality of copies of the virtual vehicle contemporaneously in the virtual test environment. Since the plurality of copies of the virtual vehicle may be on a virtual roadway at the same time, they may provide vehicle obstacles to one another on the roadway. Some of virtual vehicles on the roadway may be based on a design that is different than the design of the proposed vehicle. Since a plurality of the virtual vehicles are simulated in the virtual test environment by a plurality of client devices (e.g., dozens, hundreds, thousands or even millions of client devices), the virtual vehicle may be thoroughly tested in a shorter period of time (e.g., a day, a week, a month, etc.). The plurality of client devices may provide vehicle simulation data describing a performance of the virtual vehicle, thereby allowing the developers to determine whether the design of the proposed vehicle will be modified. The developers may modify the design of the proposed vehicle. The proposed vehicle may then be manufactured for deployment in the real world.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a method including: generating a vehicle dynamics model and a control software model for a proposed vehicle; generating a road model for generating a virtual test environment for testing a virtual vehicle simulating the proposed vehicle, the virtual vehicle being built based on the vehicle dynamics model and the control software model; compiling an executable file based on the vehicle dynamics model, the control model and the road model, the executable file configured to be executed by a processor and cause the processor to provide a simulation of the virtual vehicle in the virtual test environment; distributing, via a network, a plurality of copies of the executable file to a plurality of client devices; receiving, via the network, a set of vehicle simulation data from the plurality of client devices, where the set of vehicle simulation data describes a performance of the virtual vehicle in the test environment over a plurality of miles within the test environment; determining that the plurality of miles represents a sufficient data set for evaluating the vehicle dynamics model and the control software model; and outputting a graphical user interface to a display, where the graphical user interface depicts the performance of the virtual vehicle in the test environment. Other embodiments of this aspect include corresponding computer systems, apparatus, and computer programs recorded on one or more computer storage devices, each configured to perform the actions of the methods.

Implementations may include one or more of the following features. The method where the plurality of client devices includes a plurality of different platforms. The method where the vehicle simulation data includes a set of performance data describing the performance of the virtual vehicle in the test environment and a set of test scenario data describing a plurality of user inputs while driving the virtual vehicle that contributed to the performance of the virtual vehicle. The method where each data point included in the set of performance data describing the performance of the virtual vehicle is (1) timestamped to indicate the performance of the virtual vehicle at one or more times, (2) associated with a particular user that provided a user input that the contributed to that data point in the set of performance data, and (3) associated with a data point in the set of test scenario data that indicates the user inputs of the particular user that contributed to that data point in the set of performance data. The method where the set of test scenario data includes test environment data describing conditions present in the virtual test environment for each user input, where each data point included in the set of performance data is associated with a data point in the test environment data that describes the test environment at the time the particular user provided the user inputs that contributed to that data point in the set of performance data. The method where the plurality of miles represents the sufficient data set if the plurality of miles is greater than or equal to substantially one million kilometers. The method where the control software model includes a digital model of an Advanced Driver Assistance System included in the proposed vehicle. The method where the set of vehicle simulation data is received within thirty days of distributing the plurality of copies of the executable file to the plurality of client devices. The method where the set of vehicle simulation data is received within seven days of distributing the plurality of copies of the executable file to the plurality of client devices. The method where the set of vehicle simulation data is received within twenty-four hours of distributing the plurality of copies of the executable file to the plurality of client devices. The method further including receiving an input to generate modified model data describing one or more of a modified vehicle dynamics model for the proposed vehicle or a modified control software model for the proposed vehicle based at least in part on the set of vehicle simulation data. The method further including manufacturing the proposed vehicle based at least in part on the modified model data. The method further including manufacturing the proposed vehicle based at least in part on the modified model data. The method further including: analyzing, by a processor, the set of vehicle simulation data to identify deficient performance of the virtual vehicle; determining, by the processor, a set of proposed modifications for one or more of the vehicle dynamics model or the control software model, where the proposed modifications are configured to correct the deficient performance of the virtual vehicle; receiving an input to select one or more of the proposed modifications; and generating modified model data describing one or more of a modified vehicle dynamics model for the proposed vehicle or a modified control software model for the proposed vehicle based at least in part on the input to select one or more of the proposed modifications. Implementations of the described techniques may include hardware, a method or process, or computer software on a computer-accessible medium.

One general aspect includes a non-transitory memory including computer code which, when executed by a processor, causes the processor to perform steps including: generating a vehicle dynamics model and a control software model for a proposed vehicle; generating a road model for generating a virtual test environment for testing a virtual vehicle simulating the proposed vehicle, the virtual vehicle being built based on the vehicle dynamics model and the control software model; compiling an executable file based on the vehicle dynamics model, the control model and the road model, the executable file configured to be executed by a processor and cause the processor to provide a simulation of the virtual vehicle in the virtual test environment; distributing, via a network, a plurality of copies of the executable file to a plurality of client devices; and receiving, via the network, a set of vehicle simulation data from the plurality of client devices, where the set of vehicle simulation data describes a performance of the virtual vehicle in the test environment over a plurality of miles within the test environment. Other embodiments of this aspect include corresponding computer systems, apparatus, and computer programs recorded on one or more computer storage devices, each configured to perform the actions of the methods.

Implementations may include one or more of the following features. The non-transitory memory where the road model is built based on a set of real world road data describing roadways that exist in a real world. The non-transitory memory where the proposed vehicle is an autonomous vehicle. The non-transitory memory where the plurality of client devices includes two to one million client devices and a subset of the client devices executes their copy of the executable file contemporaneously. The non-transitory memory where one or more of the plurality of client devices is a smartphone. The non-transitory memory where a subset of the plurality of client devices executes the executable file during a same time period, resulting in a plurality of the virtual vehicles being present in the test environment at the same time period. The non-transitory memory where the plurality of the virtual vehicles provides vehicle obstacles for one another so that the road model does not include hard coded vehicle obstacles. Implementations of the described techniques may include hardware, a method or process, or computer software on a computer-accessible medium.

One general aspect includes a system including: a development device; a plurality of client devices communicatively coupled to the development via a network; where the development device includes a processor and a graphical user interface system that, responsive to being executed by the processor, causes the processor to: generate a vehicle dynamics model and a control software model for a proposed vehicle; generate a road model for providing a virtual test environment for testing a virtual vehicle simulating the proposed vehicle, the virtual vehicle being built based on the vehicle dynamics model and the control software model; compile an executable file based on the vehicle dynamics model, the control model and the road model, the executable file configured to be executed by a client-side processor and cause the client-side processor to provide a simulation of the virtual vehicle in the virtual test environment; distribute, via a network, a plurality of copies of the executable file to the plurality of client devices; and receive, via the network, a set of vehicle simulation data from the plurality of client devices, where the set of vehicle simulation data describes a performance of the virtual vehicle in the test environment over a plurality of miles within the test environment. Other embodiments of this aspect include corresponding computer systems, apparatus, and computer programs recorded on one or more computer storage devices, each configured to perform the actions of the methods.

BRIEF DESCRIPTION OF THE DRAWINGS

The disclosure is illustrated by way of example, and not by way of limitation in the figures of the accompanying drawings in which like reference numerals are used to refer to similar elements.

FIGS. 6A and 6B illustrate example GUIs according to some implementations.

DETAILED DESCRIPTION

Figure 1:
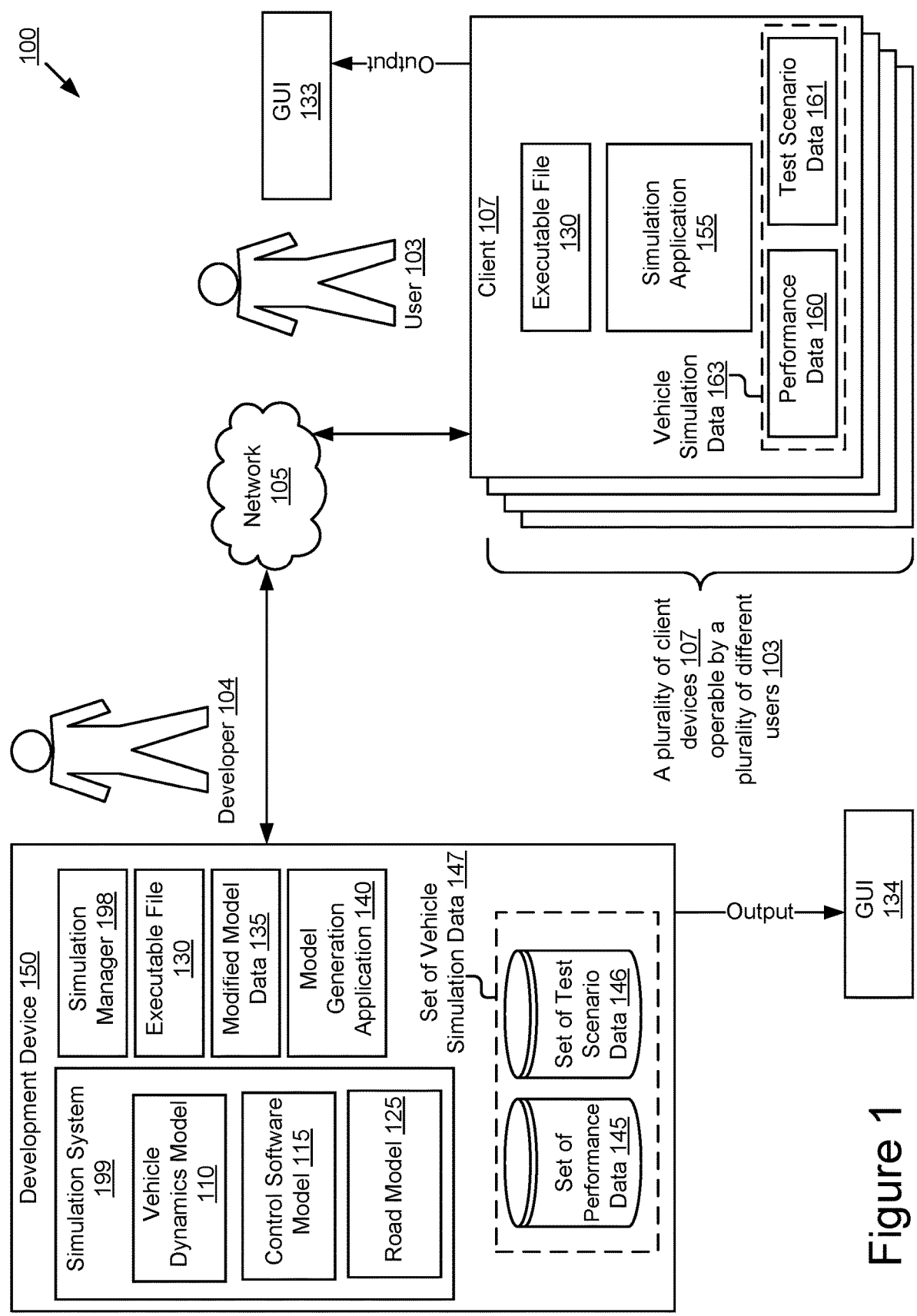
FIG. 1 is a block diagram illustrating an example operating environment for a simulation system according to some embodiments.

Design engineers use modeling software for design space exploration of their vehicle designs, including simulation of the performance of different design choices and evaluation of different design alternatives. Examples of modeling software suitable for vehicle design include Modelica platforms such as MapleSim.

Design engineers must check their vehicle designs to determine whether they conform to certain hard constraints. The hard constraints may be set by a governmental agency, a standards creation body or the manufacturer of the vehicle.

A hard constraint for a vehicle design includes a constraint that must always hold for all situations in which the driver is using the vehicle for its intended purpose. For example, so long as the vehicle is being driven on a public road at speeds that conform with legal limits, the drive shaft should not break in two, and the vehicle should continue to go forward while the accelerator is pressed because the drive shaft is intact.

A vehicle design may include ADAS software. ADAS simulation tools, such as PreScan as published by TASS International of the Netherlands, are widely used to test the correctness of ADAS software in a virtual road environment and vehicle dynamics environment before the ADAS software is deployed in an actual vehicle in the real world. In order to achieve an ADAS simulation using the ADAS software that meets industry standards, the design engineer needs to create a great number of test scenarios that demonstrate the performance of the vehicle design including the ADAS software and other behaviors of a virtual vehicle representing the vehicle design in a virtual test environment.

The process of manually generating test scenarios in the virtual test environment is time consuming. For example, each test scenario must be hand-coded by the developer and include many different details like various virtual roadways having different coefficients of friction and turning angles, other vehicles on the virtual roadway, traffic management devices (traffic signals, stop signs, railroad crossings, etc), pedestrians, etc. Developers would prefer to avoid having to hand-code all these details. The graphical user interface ("GUI") system described herein allows developers to test their vehicle designs without having to hand-code the other vehicles on the virtual roadway.

Another deficiency of the current process for testing designs for a proposed vehicle is that many instances of simulated scenarios are needed to comply with best practices. For example, the virtual vehicle may need to be tested for a million miles in the virtual test environment before actual vehicles may be manufactured based on the vehicle design including the ADAS software. Since the ADAS software currently on the market only allows one simulation of the virtual vehicle at a given time, and the tests must include hundreds of thousands of miles in the virtual test environment, it may take months or even years to complete the tests. The simulation system described below solves this problem by enabling many users (e.g., dozens, hundreds, thousands or millions of users) to test a virtual vehicle contemporaneously and provide the developers with vehicle simulation data describing the performance of the virtual vehicle. Our research indicates that a design for a proposed vehicle may be sufficiently tested in less than twenty-four hours using the simulation system. For example, if one million users drive a copy of the virtual vehicle one mile in the virtual test environment during a given twenty-four hour period, then the design for the proposed vehicle will be sufficiently tested at the end of the twenty-four hour period.

In some implementations, the simulation system may include a vehicle model generation application, a control software model generation application and a game engine. The simulation system may be communicatively coupled to a network. The simulation system may be operated by a developer. The developer may include a human. The human may include a design engineer. The developer may user the simulation system to design a proposed vehicle.

In some implementations, the developer may develop a vehicle dynamics model and a control software model using one or more model generation applications. For example, the vehicle model generation application generates the vehicle dynamics model based on inputs from the developer. The control software model generation application may generate the control software model based on inputs from the developer. The vehicle dynamics model may include portions of a design for the proposed vehicle. The control software model may include ADAS software that is included in the design for the proposed vehicle. The proposed vehicle may include an autonomous or semi-autonomous vehicle.

In some implementations, the developer may develop a road model using the game engine. For example, the game engine may generate the road model based on inputs from the developer. The road model may be configured to generate a virtual test environment for testing the performance of a virtual vehicle that simulates, within the virtual test environment, the proposed vehicle and the control software included in the proposed vehicle. The road model may be based on one or more real world roadway systems. For example, the game engine may be communicatively coupled to a database that includes data describing a set of real world roadway models.

In some implementations, the developer may upload the vehicle dynamics model and the control software model to the game engine. The game engine may also include the road model.

In some implementations, the game engine builds an executable file. For example, the game engine compiles an executable file based on the vehicle dynamics model, the control software model and the road model. The executable file may be configured to be executed by a processor and cause the processor to provide a simulation of the virtual vehicle in the virtual test environment. The processor may be an element of a client device. A user of the client device may drive the virtual vehicle in the virtual test environment. As the user drives the virtual vehicle in the test environment, the executable file (or some other client-side component) may gather vehicle simulation data describing the performance of the virtual vehicle and the control software included in the virtual vehicle.

In some implementations, the simulation system distributes copies of the executable file to one or more client devices. The one or more client devices may also be communicatively coupled to the network. The simulation system may distribute the copies of the executable file to the one more client devices via the network.

The client device may be operated by the user. The user may be a human. The client device may include a processor-based computing device. For example, the client device may include a smartphone, laptop, tablet computing device, smartwatch, set-top box, smart television, game console, etc.

In some implementations the client device executes the executable file to provide a simulation including the virtual vehicle to be tested in the virtual test environment. The virtual vehicle is built based on the vehicle dynamics model and the control software model. The virtual test environment is built based on the road model. The virtual test environment may include roadway objects such as other vehicles, pedestrians, traffic management devices, etc. Some of the roadway objects in the simulation may be virtual vehicles that are being driven by other users in substantially real time; these virtual vehicles may be based on the same set of models or a different set of models. For example, two or more client devices may be executing their copies of the executable file contemporaneously.

In some implementations, the client devices collect the vehicle simulation data describing the performance of the simulated vehicle and the simulated software included in the vehicle.

In some implementations, the client devices may transmit the vehicle simulation data to the simulation system.

In some implementations, the simulation system may aggregate the vehicle simulation data received from the plurality of client devices to form a set of vehicle simulation data.

In some implementations, the development device may output a GUI including the set of vehicle simulation data and optionally analysis provided by the simulation system.

In some implementations, the developer may develop modified vehicle dynamics model or modified control software model using one or more model generation applications based on the set of vehicle simulation data.

In some implementations, the proposed vehicle may be manufactured based on one or more of the modified vehicle dynamics model or the modified control software model.

Example System Overview

FIG. 1 is a block diagram illustrating an example operating environment 100 for a simulation system 199 according to some embodiments. The operating environment 100 includes a client 107 and a development device 150. In the illustrated embodiment, these entities of the environment 100 may be communicatively coupled via a network 105. The client 107 may be operated by a user 103. The development device 150 may be operated by a developer 104. The client 107 may provide a GUI 133 as an output responsive to executing an executable file 130 compiled by the development device 150. The operating environment 100 may include a plurality of clients 107 that are each operable by a different user 103. Each of the plurality of clients 107 may include its own copy of the executable file 130 and may gather vehicle simulation data 163 responsive to executing the executable file 130. The plurality of clients 107 may transmit the vehicle simulation data 163 to the development device 150 via the network 105. The development device 150 may provide a GUI 134 as an output responsive to receiving vehicle simulation data 163 from the plurality of clients 107.

The development device 150 and the client 107 can be used by way of example. While FIG. 1 illustrates one development device 150, the disclosure applies to an operating environment 100 having one or more development devices 150. Furthermore, although FIG. 1 illustrates one network 105 coupled to development device 150 and the plurality of clients 107, in practice one or more networks 105 can be connected to these entities.

The network 105 can be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices may communicate. In some implementations, the network 105 may be a peer-to-peer network. The network 105 may also be coupled to or include portions of a telecommunications network for sending data in a variety of different communication protocols. In some implementations, the network 105 includes Bluetooth® communication networks or a cellular communications network for sending and receiving data via short messaging service (SMS), multimedia messaging service (MMS), hypertext transfer protocol (HTTP), direct data connection, WAP, e-mail, etc. The network 105 may be a mobile data network such as 3G, 4G, LTE, Voice-over-LTE ("VoLTE"), or any other mobile data network or combination of mobile data networks.

The development device 150 may include a hardware server that includes a processor, a memory and network communication capabilities. The development device 150 may also include a laptop, personal computer, tablet computer or some other processor-based computing device. The development device 150 may be communicatively coupled to the network 105.

The development device 150 may be operable by a developer 104. The developer 104 may include a human design engineer. The developer 104 may use the development device 150 to develop a proposed vehicle. The proposed vehicle may include an autonomous vehicle or a semi-autonomous vehicle. The proposed vehicle may include ADAS software.

The development device 150 may include one or more of the following elements: a simulation system 199; a model generation application 140; an executable file 130; a simulation manager 198; a set of vehicle simulation data 147; and modified model data 135.

The simulation system 199 may include a computing device operable to crowdsource the set of vehicle simulation data 147 from the plurality of clients 107 and provide a GUI 134 to the developer 104 to assist the developer 104 in modifying the design of the proposed vehicle by generating the modified model data 135. The simulation system 199 is described in more detail below with reference to FIGS. 2A, 2B, 3A, 3C, 6A and 6B.

The simulation system 199 may include one or more of the following elements: a vehicle dynamics model 110; a control software model 115; and a road model 125.

In some implementations, the vehicle dynamics model 110 may include software operable to estimate the physics and motion of the proposed vehicle. For example, the vehicle dynamics model 110 may be a portion of the executable file 130. The client 107 executes the executable file 130, resulting in a virtual simulation of the proposed vehicle. For example, the simulation may include a virtual vehicle representing the proposed vehicle and a virtual test environment for driving the virtual vehicle. As the user 103 drives the virtual vehicle in the virtual test environment, the client 107 collects test scenario data 161 describing (1) the user inputs which correspond to the actions associated with the user driving the virtual vehicle and (2) the virtual test environment present at the time of the user inputs. The virtual test environment may include angle of the roadway, the coefficient of friction of the roadway, other virtual vehicles present on the roadway and their influence on the performance of the virtual vehicle, pedestrians and their influence on the performance of the virtual vehicle, traffic management devices and their influence of the virtual vehicle, and any other elements included in the virtual test environment at the time of the user inputs (the data describing the user inputs and the data describing the virtual test environment may be timestamped so that the two may be correlated and associated with one another by time). The client 107 collects the test scenario data 161 and transmits it to the development device 150 via the network 105. The development device 150 aggregates the test scenario data 161 from a plurality of clients 107 to form the set of test scenario data 146. The vehicle dynamics model 110 may include software that estimates the physics and motion of the proposed vehicle based in part on the test scenario data 161 (if the vehicle dynamics model 110 is present on the client 107 side of the network 105) or the set of test scenario data 146 (if the vehicle dynamics model 110 is present on the development device 150 side of the network 105). In this way, the vehicle dynamics model 110 estimates how the virtual vehicle should respond to the user inputs and the virtual test environment at a given time in order to accurately represent the proposed vehicle in the virtual test environment. This may enable the client 107 to collect performance data 160 that accurately describes how the proposed vehicle would perform in a real world environment that is similar to the virtual test environment when the proposed vehicle is driven in the real world in a way that corresponds to the user inputs.

The model generation application 140 may include a vehicle model generation application (see, e.g., element 140A described below for FIG. 2A). The vehicle model generation application may include software operable to generate the vehicle dynamics model 110 based on inputs provided by the developer 104. An example of the vehicle model generation application may include Dymola (produced by Dassault Systemes AB, Lund of Velizy-Villacoublay, France), MapleSim (produced by Maplesoft of Waterloo, Ontario) or some other Modelica platform.

In some implementations, the control software model 115 may include software operable to estimate the performance of the ADAS software in the proposed vehicle based in part on the test scenario data 161 (if the vehicle dynamics model 110 is present on the client 107 side of the network 105) or the set of test scenario data 146 (if the vehicle dynamics model 110 is present on the development device 150 side of the network 105). In this way, the control software model 115 estimates how the ADAS software should respond to the user inputs and the virtual test environment at a given time in order to accurately represent to proposed vehicle in the virtual test environment. This may enable the client 107 to collect performance data 160 that accurately describes how the how the proposed vehicle or the ADAS software would perform in a real world environment that is similar to the virtual test environment when the proposed vehicle is driven in the real world in a way that corresponds to the user inputs.

The model generation application 140 may include a control software model generation application (see, e.g., element 140B described below for FIG. 2A). The vehicle model generation application may include software operable to generate the control software model 115 based on inputs provided by the developer 104. An example of the vehicle model generation application may include Simulink (produced by MathWorks of Natick, Mass.), PreScan (produced by TASS International of the Netherlands) or some other software for generating control software models.

In some implementations, the road model 125 is software that when executed causes a processor to generate the virtual test environment.

The road model 125 may define one or more of the following parameters for a roadway system included in the virtual test environment: speed limit; total number of lanes included in the roadway; total number of right-hand lanes included in the roadway; total number of left-hand lanes included in the roadway; roadway length; land width for each lane included in the roadway; the dividing line striping option for each lane transition (e.g., no dividing line; broken or dashed line; solid double line; solid line or left and broken line on the right; broken line ort the left and solid line on the right; double solid line); the edge line for each outside lane; the visibility of dividing line options or edge line by automobile sensors such as cameras (e.g., is the dividing line or edge line obscured or old so that is hard to identify by the sensors of an autonomous vehicle); shoulder width; foreslope on the left or right-hand side; roadway cross-slope on the left or right-hand side; placement of curves along the roadway; angle of curves along the roadway; roadway slope inside of curves along the roadway; coefficients of friction along the roadway, transitions from coefficients for friction along the roadway and the placement of these transitions on the roadway, etc.

Figure 2A:
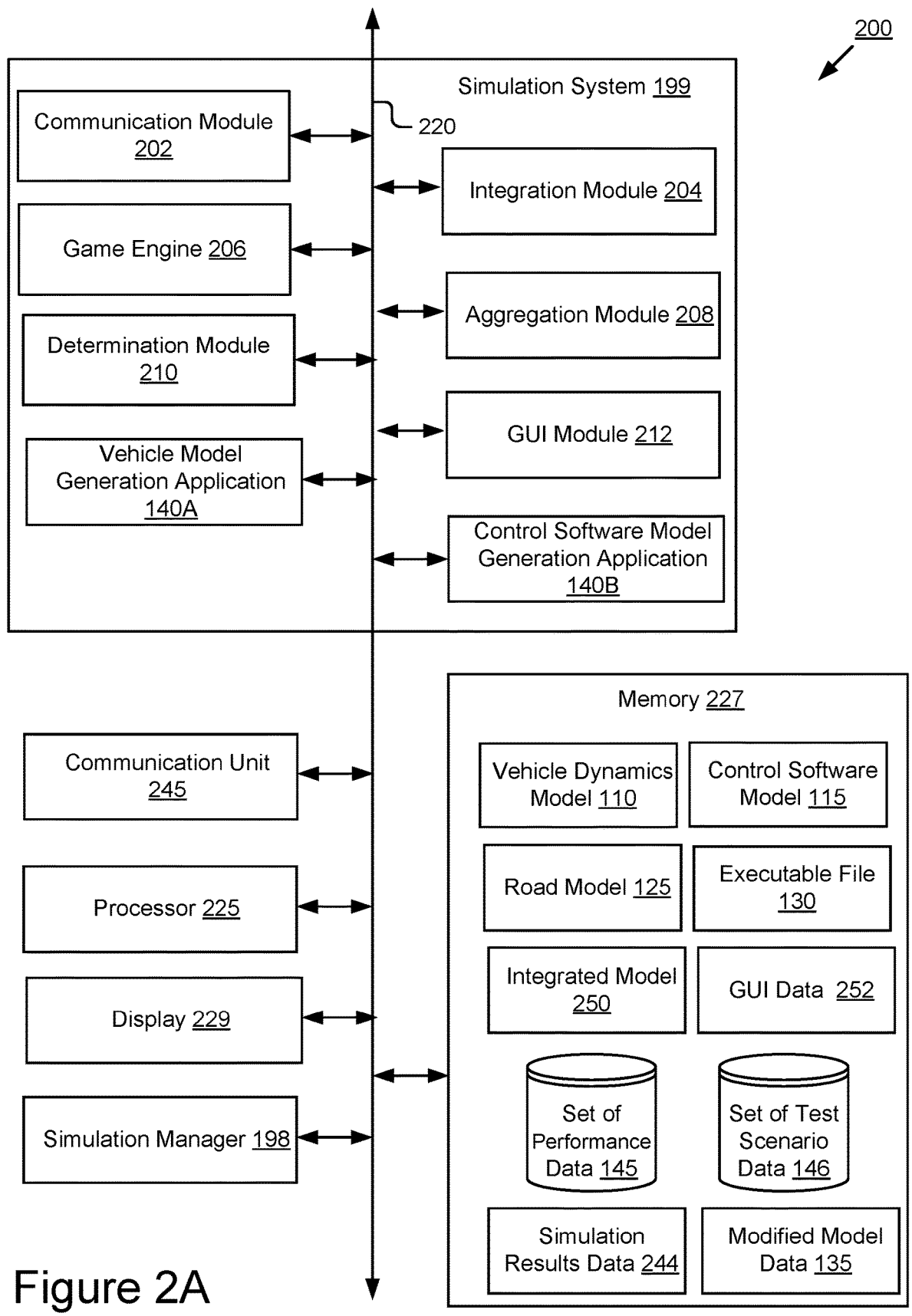
FIG. 2A is a block diagram illustrating an example computer system including a simulation system according to some embodiments.

The simulation system 199 may include a game engine (see, e.g., element 206 of FIG. 2A). The game engine 206 may include software operable to create and develop video games. The game engine 206 may include software for generating the road model 125 based on inputs provided by the developer 104. An example of the game engine 206 may include the Unity game engine (produced by Unity Technologies of San Francisco, Calif.) or some other game engine.

The game engine 206 may include software that is operable to compile the executable file 130 based on the vehicle dynamics model 110, the control software model 115 and the road model 125. The executable file 130 may include software that is operable to provide a simulation of the virtual vehicle in the virtual test environment when executed by a processor of the client 107.

In some implementations, the road model 125 may be based in part on roadway systems present in the real world. For example, the game engine 206 may include (or have access to) roadway realism data. The roadway realism data may describe, for each of the real world roadways included in the road model 125, one or more of the following roadway parameters for a roadway system that is actually present in the real word: speed limit; total number of lanes included in the roadway; total number of right-hand lanes included in the roadway; total number of left-hand lanes included in the roadway; roadway length; land width for each lane included in the roadway; the dividing line striping option for each lane transition (e.g., no dividing line; broken or dashed line; solid double line; solid line or left and broken line on the right; broken line on the left and solid line on the right; double solid line); the edge line for each outside lane; the visibility of dividing line options or edge line by automobile sensors such as cat eras (e.g., the dividing line or edge line obscured or old so that is hard to by the sensors of an autonomous vehicle); shoulder width; foreslope on the left or right-hand side; roadway cross-slope on the left or right-hand side; placement of curves along the roadway; angle of curves along the roadway; roadway slope inside of curves along the roadway; coefficients of friction along the roadway, transitions from coefficients for friction along the roadway and the placement of these transitions on the roadway, etc.

Different real world roadway systems included in the road model 125 may be described by different combinations of roadway parameters.

The simulation system 199 may distribute a plurality of copies of the executable file 130 to the plurality of clients 107 via the network 105. The plurality of clients 107 execute the executable file 130 and periodically report the vehicle simulation data 163 back to the simulation system 199. For example, the executable file 130 includes code and routines configured to call home to the simulation system 199. The call home may include the vehicle simulation data 163. The simulation system 199 may aggregate the vehicle simulation data 163 from the plurality of clients 107 to form the set of vehicle simulation data 147. The set of vehicle simulation data 147 may represent hundreds, thousands or even millions of miles traveled by the virtual vehicle in the virtual test environment in twenty-four hours or less (or seven days or less, or thirty days or less, or some other time period that is shorter than traditional simulation of vehicle designs including ADAS software).

The set of vehicle simulation data 147 includes one or more of the following: a set of performance data 145; and the set of test scenario data 146.

Figure 4A:
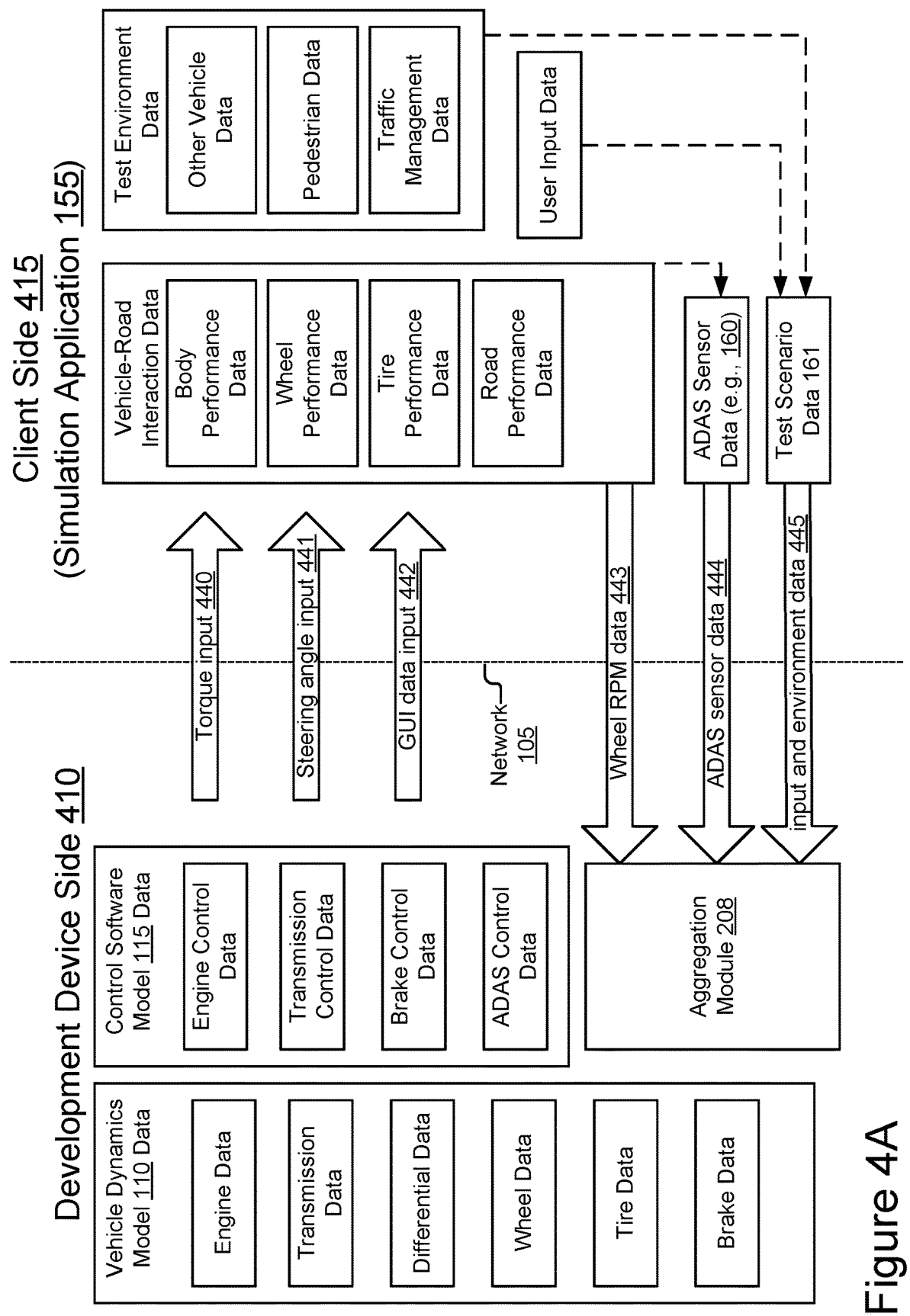
FIGS. 4A and 4B are block diagrams illustrating a development device side and client side operations performed when the executable file is executed on the client side according to some implementations.
Figure 4B:
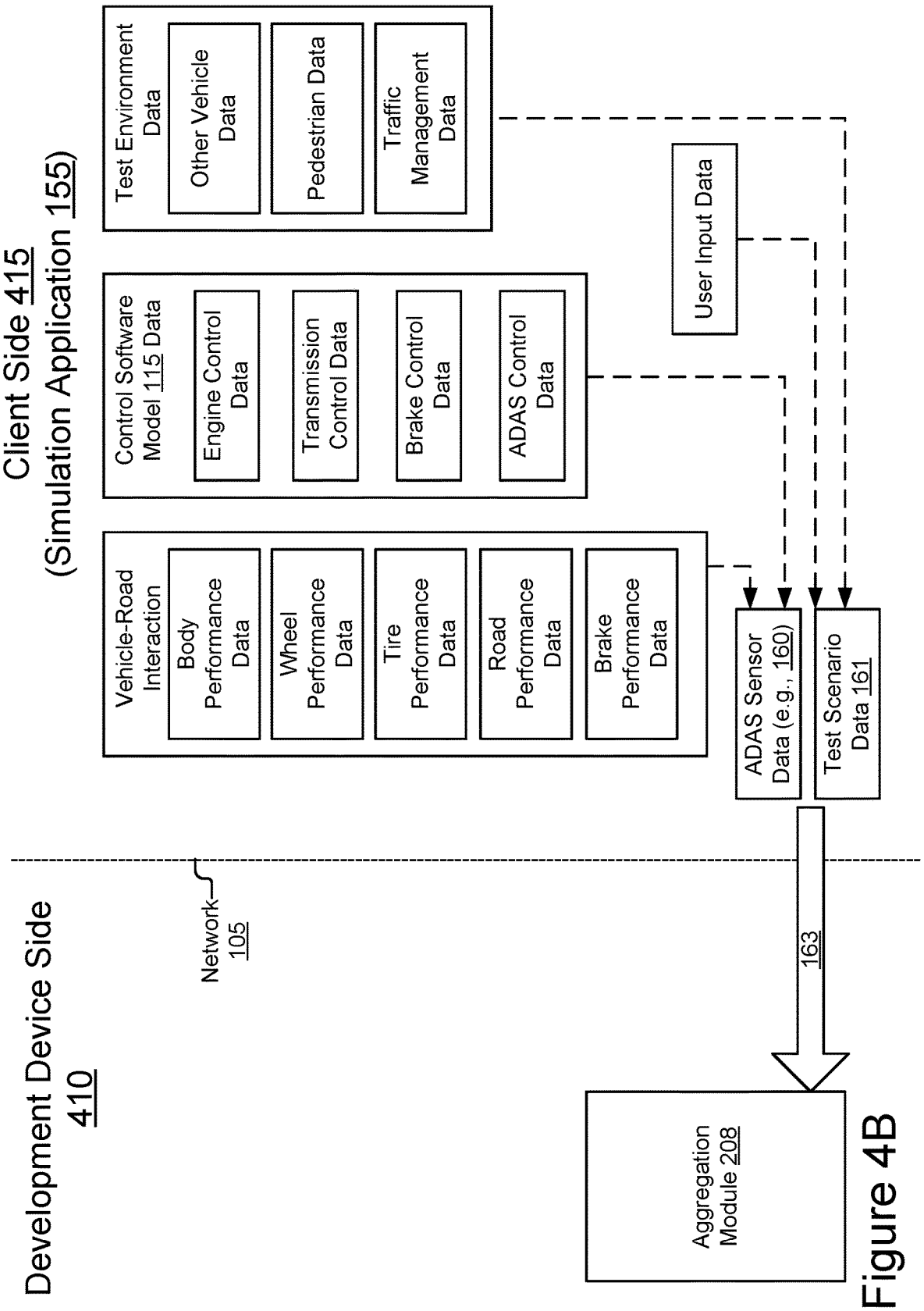

The set of test scenario data 146 was described above with reference to the vehicle dynamics model 110, and so, that description will not be repeated here. Example elements of the set of test scenario data 146 (or the test scenario data 161) are depicted in FIGS. 4A and 4B.

The set of performance data 145 includes the aggregated performance data 160 received from the client 107 via the network 105. The performance data 160 describes the performance of the virtual vehicle, and the ADAS software, in the virtual test environment. For example, the performance data 160 describes one or more of the following: the rotations per minute of the wheels of the virtual vehicle; simulated ADAS sensor data; the torque of the wheels over time; the performance of the body and frame of the virtual vehicle; the performance of the wheels of the virtual vehicle; the performance of the tires of the virtual vehicle (did a tire rupture or experience abnormal tread wear); performance of the road of the virtual test environment when driven over by the virtual vehicle; performance of the brakes of the virtual vehicle; whether a component of the virtual vehicle failed in the simulation (e.g., broken axle, etc.); engine control data; transmission control data; brake control data; ADAS control data; and etc. Example elements of the set of performance data 145 (or the performance data 160) are depicted in FIGS. 4A and 4B.

The simulation manager 198 includes software operable to manage, from the development device 150, one or more aspects of the execution of the executable file 130 on the plurality of clients 107. For example, the executable file 130 may call the simulation manager 198 and provide feedback to the simulation manager 198 describing the vehicle simulation data 163. The simulation manager 198 may monitor the execution of the executable file 130 across the plurality of clients 107 and ensure that the virtual test environment for the various simulations is diverse and representative of the real world so that the set of vehicle simulation data 147 meets a threshold set by the developer 104 for being considered a representative sample. The simulation manager 198 may provide an input to the executable file 130 to cause the virtual test environment to be modified to ensure that the threshold is met. In this way, the simulation manager 198 may assist the simulation system 199 to obtain a representative sample of the set of vehicle simulation data 147 in twenty-four hours or less after distributing the executable file 130 to the plurality of clients 107.

Figure 6A:
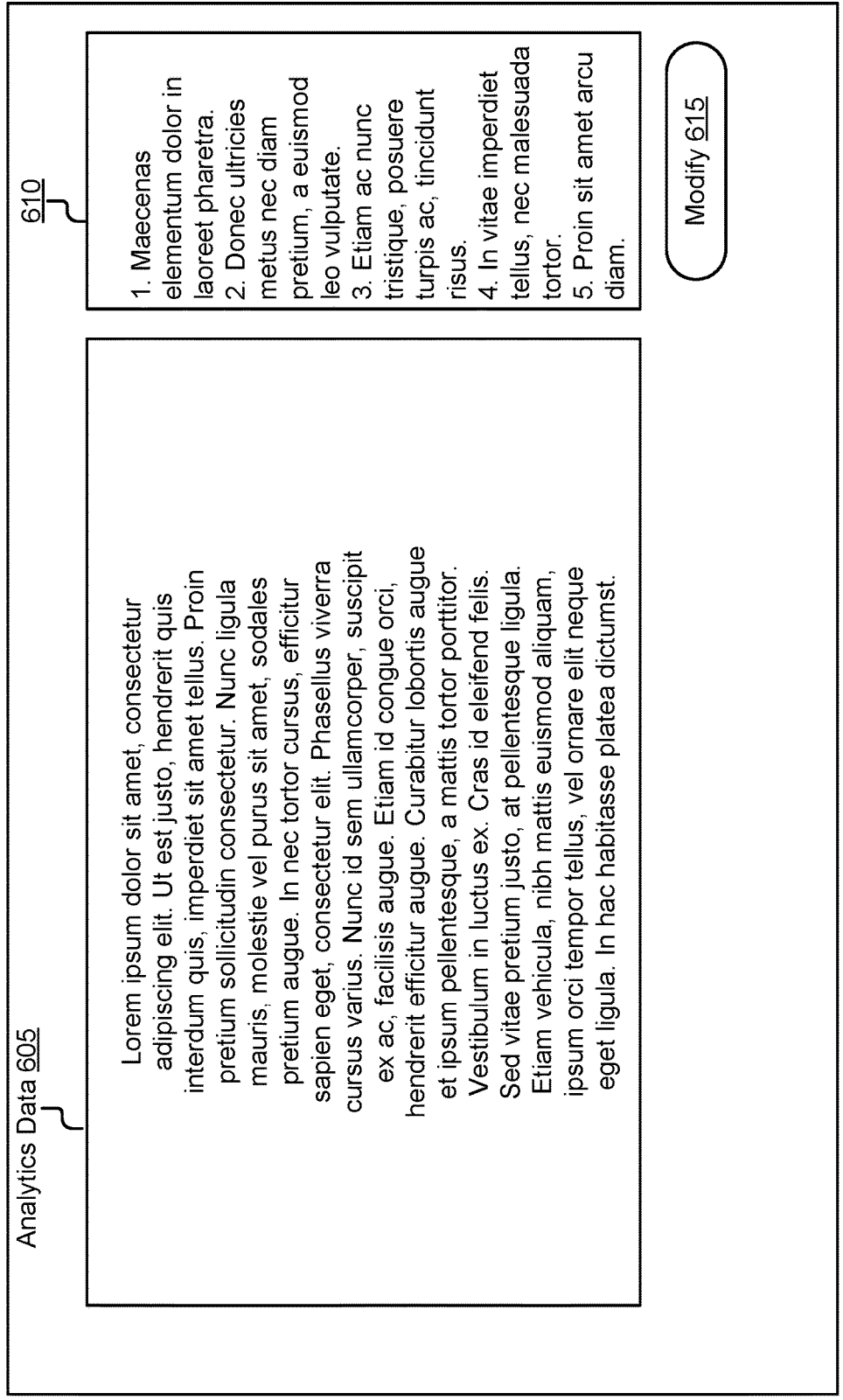

The simulation system 199 may generate a GUI 134 that visually depicts analytics data that describes the performance of the virtual vehicle, including the ADAS software of the virtual vehicle, for the various simulations performed by the plurality of clients 107 during some period of time. An example of the GUI 134 is depicted in FIG. 6A. The GUI may include a visual depiction of the elements of the vehicle dynamics model 110 or the control software model 115 that may be modified in order to improve the performance of the virtual vehicle or the ADAS software included in the virtual vehicle. The GUI 134 may include a graphical element which may be selected by the developer 104 to select aspects of the vehicle dynamics model 110 or the control software model 115 to modify. The model generation application 140 may modify one or more of the vehicle dynamics model 110 or the control software model 115 based on this selection to generate the modified model data 135.

The modified model data 135 describes one or more of a vehicle dynamics model 110 or a control software model 115 for the proposed vehicle that has been modified based on a set of vehicle simulation data that is cloudsourced from a plurality of clients 107.

The client 107 may include a processor-based computing device. For example, the client 107 may include one or more of the following: a personal; a special-purpose computing device; a laptop; a tablet computer; a smartphone; a set-top box; a smart television; a gaming console; etc. The client 107 may be communicatively coupled to the network 105. The client 107 may include conventional peripherals for receiving one or more inputs and providing one or more outputs.

The client 107 includes one or more of the following: the executable file 130; a simulation application 155; and the vehicle simulation data 163. The executable file 130 and the vehicle simulation data 163 were described above, and so, these descriptions will not be repeated here.

The simulation application 155 may include software operable to provide a platform for the executable file 130. For example, the simulation application 155 may include any software necessary for the client 107 to execute the executable file 130 and provide the simulation to the user 103 and the vehicle simulation data 163 to the simulation system 199.

In some implementations, the simulation application 155 may include a physics engine. The physics engine may be operable with the executable file 130.

The plurality of clients 107 may include various different platforms. Some of the plurality of clients 107 may include gaming consoles of different types (e.g., Microsoft™ XBOX™, Sony™ PlayStation™, Nintendo™ Wi™ or any derivative or later version thereof), personal computers of various types (Microsoft™ Windows™, Apple™ OS™ or any Unix-based OS), smartphones or tablet computers of various types (Android™, Apple iOS™, Unix-based mobile or tablet computer operating environment, or any derivative or later version thereof), etc. Accordingly, the executable file 130 may be platform agnostic.

Figure 5A:
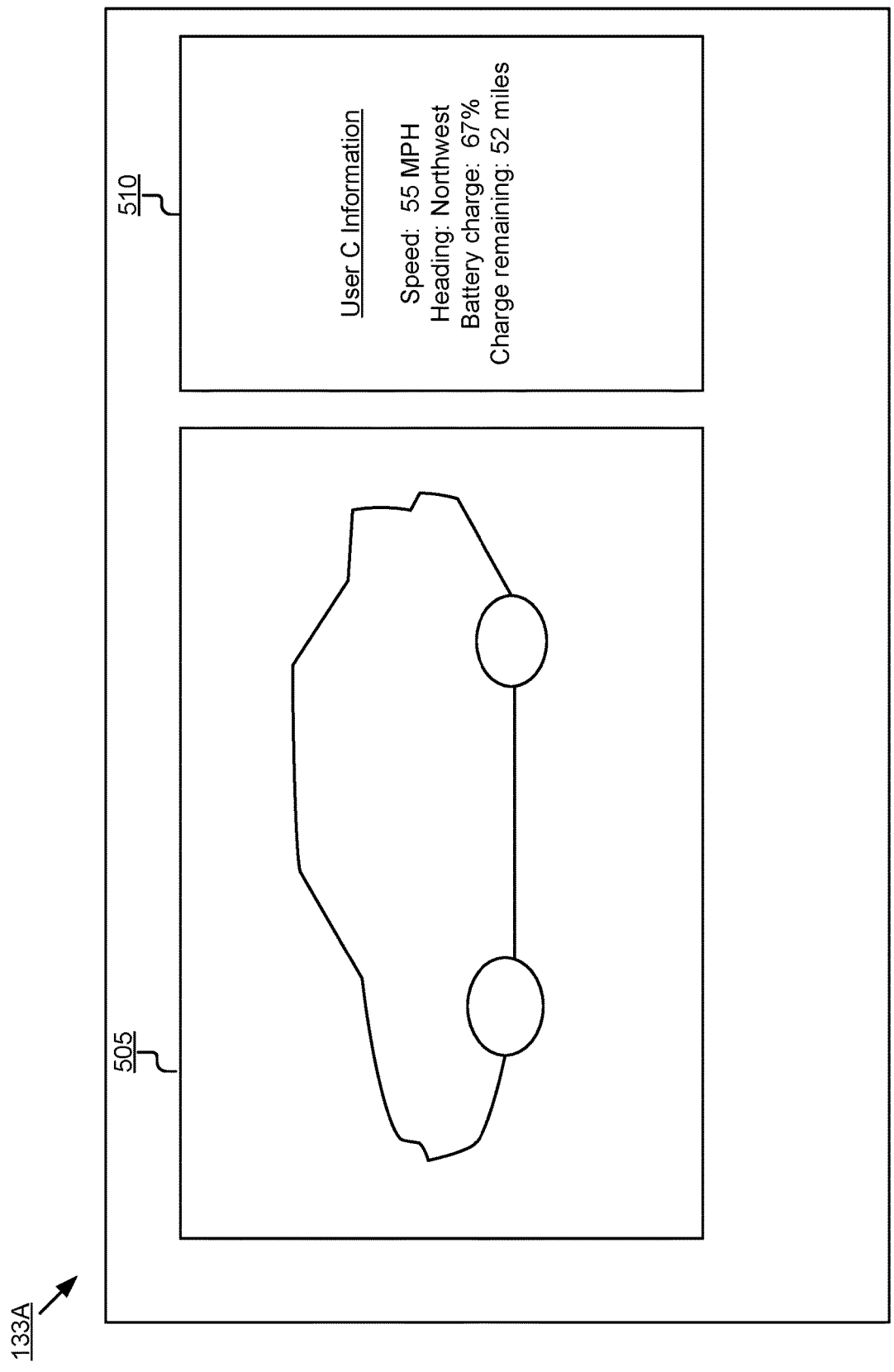
FIGS. 5A and 5B illustrate example GUIs according to some implementations.
Figure 5B:
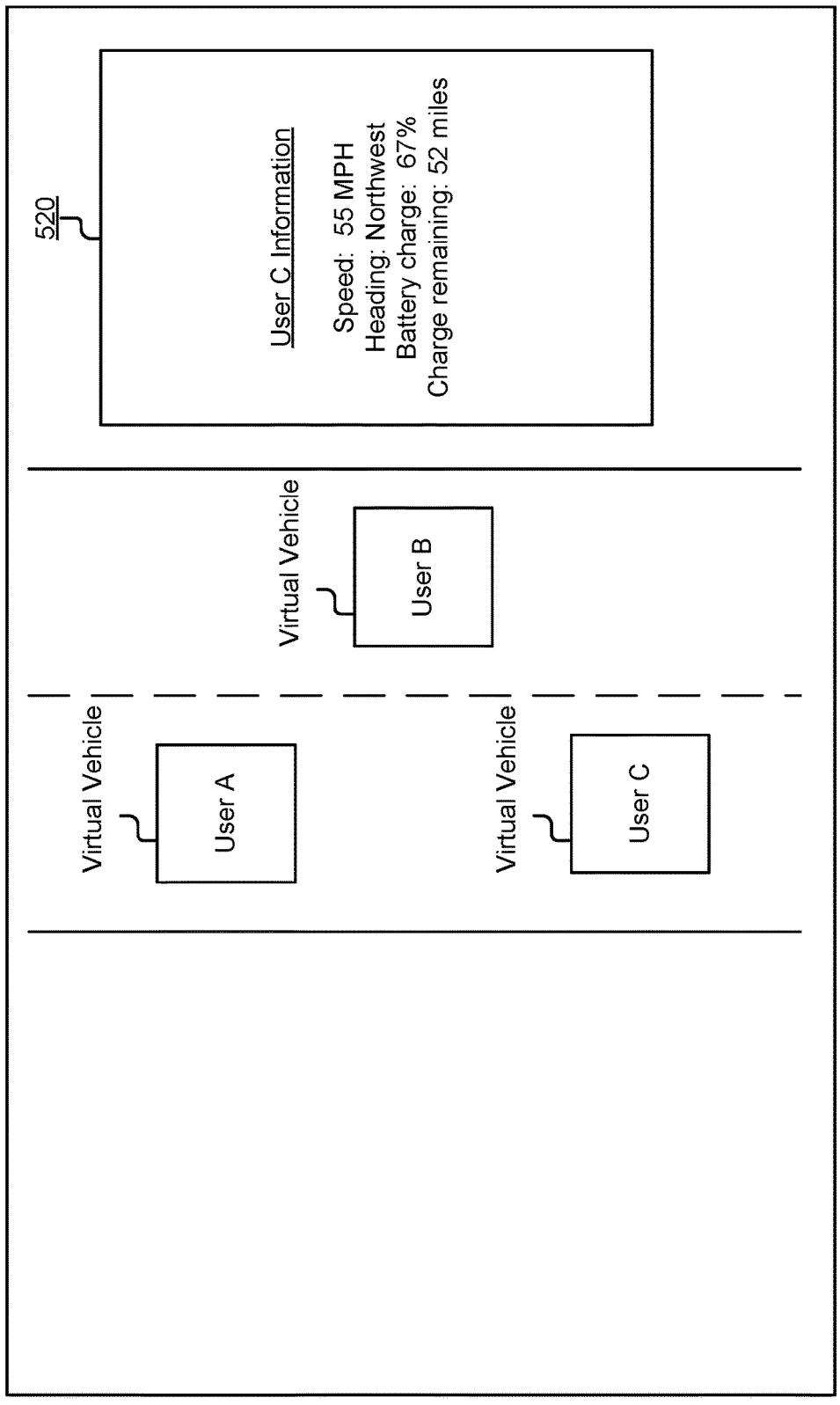

The client 107 may output a GUI 133 responsive to executing the executable file 130. Examples of the GUI 133 are shown in FIGS. 5A and 5B.

The client 107 and the development device 150 may include conventional peripherals for receiving inputs and providing outputs.

In some implementations, the simulation system 199 may be implemented using hardware including a field-programmable gate array ("FPGA") or an application-specific integrated circuit ("ASIC"). In some other implementations, the simulation system 199 may be implemented using a combination of hardware and software. The simulation system 199 may be stored in a combination of the devices and servers, or in one of the devices or servers.

In some implementations, the simulation system 199 may include code and routines configured to perform one or more steps of the method 300 described below with reference to FIGS. 3A and 3B when executed by a processor, such as processor 225, described below with reference to FIG. 2A.

Example Simulation System

FIG. 2A is a block diagram illustrating an example computer system 200 including the simulation system 199 according to some embodiments. In some implementations, the simulation system 199 may include an electronic device programmed or configured to perform one or more blocks of the method 300 described below with reference to FIGS. 3A and 3B. In some implementations, the simulation system 199 may include a special-purpose computing device configured to provide some or all of the functionality described above with reference to the simulation system 199 or below with reference to method 300 described below with reference to FIGS. 3A and 3B.

The computer system 200 may include the development device 150. The computer system 200 may include one or more of the following elements: the simulation system 199; a communication unit 245; a processor 225; a memory 227; a display 229; and the simulation manager 198. The components of the computer system 200 are communicatively coupled by a bus 220. In some embodiments, the components of the computer system 200 are local to the same hardware so that the bus 220 is not necessary for communication among the components of the computer system 200. In some embodiments, communication structures or methods other than the bus 220 may be implemented.

The simulation manager 198 was described above with reference to FIG. 1, and so, that description will not be repeated here.

The communication unit 245 may include hardware that transmits and receives data to and from the network 105. In some implementations, the communication unit 245 includes a port for direct physical connection to the network 105 or to another communication channel. For example, the communication unit 245 includes a USB, SD, CAT-5, or similar port for wired communication with the network 105. In some implementations, the communication unit 245 includes a wireless transceiver for exchanging data with the network 105 or other communication channels using one or more wireless communication methods, including IEEE 802.11, IEEE 802.16, Bluetooth®, or another suitable wireless communication method.

In some implementations, the communication unit 245 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some implementations, the communication unit 245 includes a wired port and a wireless transceiver. The communication unit 245 also provides other conventional connections to the network 105 for distribution of files or media objects using standard network protocols including TCP/IP, HTTP, HTTPS, and SMTP, etc.

The processor 225 includes an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2A includes a single processor 225, multiple processors 225 may be included. The processor 225 may include a graphical processing unit. Other processors, operating systems, sensors, displays, and physical configurations may be possible.

The display 229 is an electronic device configured for the visual presentation of data. For example, the display 229 may be configured for the visual presentation of the GUI data 252. The display 229 may receive the GUI data 252 and output a GUI.

The memory 227 is a tangible or non-transitory storage medium that stores instructions or data that may be accessed and executed by the processor 225. The instructions or data may include code for performing the techniques described herein. The memory 227 may include a dynamic random access memory (DRAM) device, a static random access memory (SRAM) device, flash memory, or some other memory device. In some implementations, the memory 227 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The memory 227 may include one or more of the following elements: the vehicle dynamics model 110; the control software model 115; the road model 125; the executable file 130; an integrated model 250; GUI data 252; the set of performance data 145; the set of test scenario data 146; simulation results data 244; the modified model data 135. The following elements were described above with reference to FIG. 1, and so, their descriptions will not be repeated here: the vehicle dynamics model 110; the control software model 115; the road model 125; the executable file 130; the set of performance data 145; the set of test scenario data 146; and the modified model data 135.

Figure 2B:
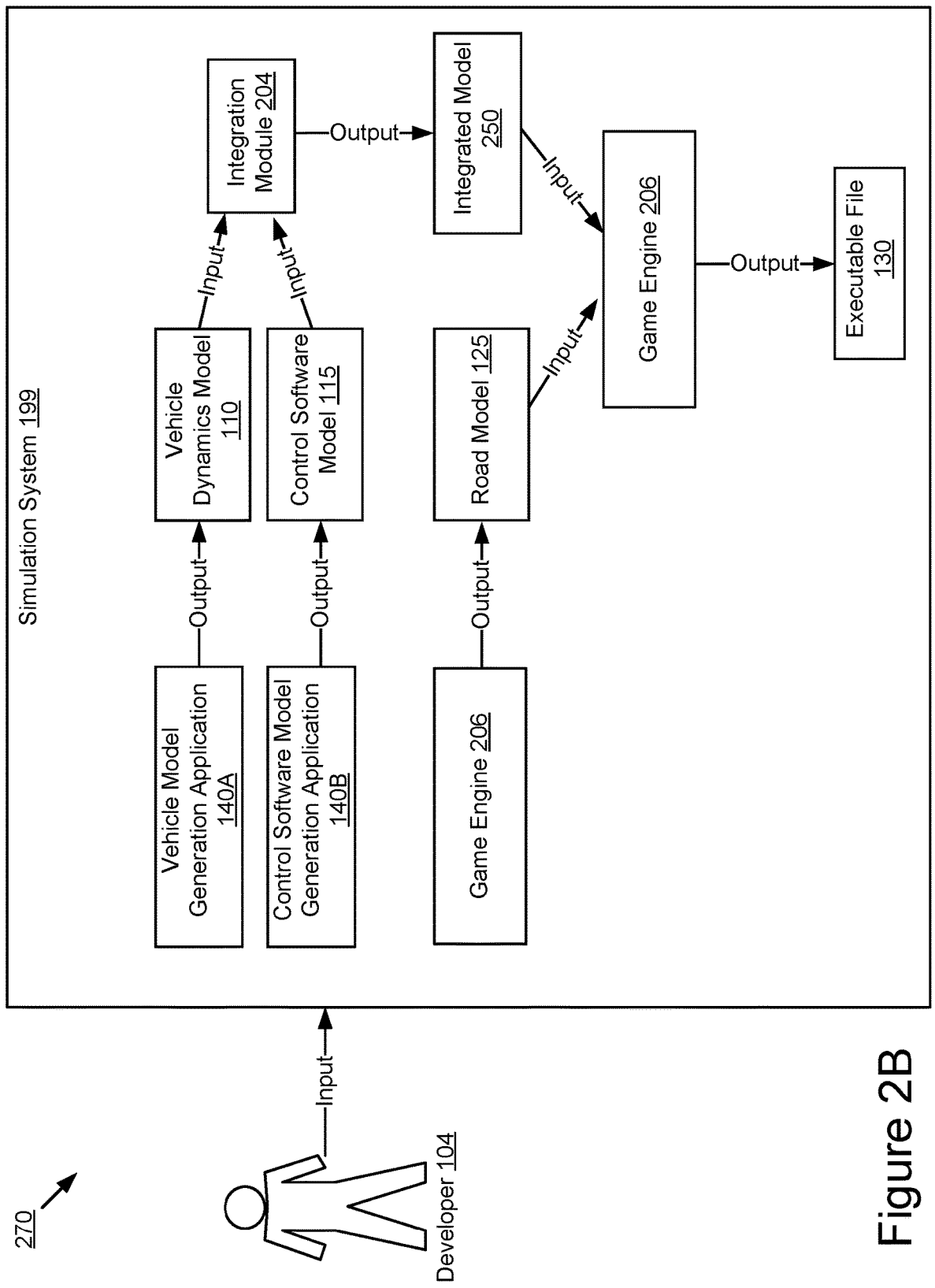
FIG. 2B is a block diagram illustrating an example flow process including a simulation system according to some embodiments.

The integrated model 250 describes a vehicle model that results from integrating the vehicle dynamics model 110 and the control software model 115. The result of this integration is the integrated model 250. An example of the integrated model 250 is depicted in FIG. 2B.

The GUI data 252 includes graphical data used to output GUIs to the display 229 (or a display of the client 107). For example, the GUI data 252 includes graphical data used to output one or more of the GUIs 133, 134 depicted in one or more of FIGS. 5A, 5B, 6A and 6B.

In some embodiments, various aspects of the simulation provided by a client 107 executing the executable file 130 are provided by the simulation manager 198. For example, the simulation manager 198 may be a cloud-based resource for the client 107. This beneficially enables the client 107 to be a device that operates based on a mobile processor, an ARM processor or a GPU. The simulation results data 244 may describe the data that results from the simulation manager 198 executing aspects of the simulation for the client 107. The simulation manager 198 may transmit the simulation results data 244 to the client 107 in real time or substantially real time so that the simulation may provide a substantially lag-free user experience to the user 103 of the client 107.

In some implementations, the simulation system 199 includes one or more of the following elements: a communication module 202; an integration module 204; a game engine 206; an aggregation module 208; a determination module 210; a GUI module 212; the vehicle model generation application 140A; and the control software model generation application 140B. These elements of the simulation system 199 may be communicatively coupled to the bus 220. One or more of these elements of the simulation system 199 may be stored in the memory 227 of the simulation system 199 and accessible and executable by the processor 225. The following elements of the simulation system 199 were described above with reference to FIG. 1, and so, these descriptions will not be repeated here: the game engine 206; the vehicle model generation application 140A; and the control software model generation application 140B The communication module 202 may include code and routines configured to handle communications between the simulation system 199 and other components of the computer system 200. In some implementations, the communication module 202 can include a set of instructions executable by the processor 225 to provide the functionality described below for handling communications between the development device 150 and other components of the environment 100 described above with reference to FIG. 1. In some implementations, the communication module 202 can be stored in the memory 227 of the simulation system 199 and can be accessible and executable by the processor 225.

The communication module 202 sends and receives data, via the communication unit 245, to and from the network 105. For example, the communication module 202 receives, via the communication unit 245, the set of performance data 145 and the set of test scenario data 146 from the network 105. The communication module 202 may send the executable file 130 to the plurality of clients 107 via the communication unit 245.

In some embodiments, the communication module 202 receives data from components of the simulation system 199 and stores the data in the memory 227. For example, the communication module 202 receives the vehicle dynamics model 110 from the vehicle model generation application 140A and stores the vehicle dynamics model 110 in the memory 227.

The integration module 204 may include code and routines configured to integrate the vehicle dynamics model 110 and the control software model 115 to form the integrated model 250. In some implementations, the integration module 204 can be stored in the memory 227 of the computer system 200 and can be accessible and executable by the processor 225.

The aggregation module 208 may include code and routines configured to (1) aggregate performance data 160 received from the plurality of clients 107 to form the set of performance data 145 and (2) aggregate the test scenario data 161 received from the plurality of clients 107 to form the set of test scenario data 146. The aggregation module 208 may further aggregate the set of performance data 145 and the set of test scenario data 146 to form the set of vehicle simulation data 147. In some implementations, the aggregation module 208 can be stored in the memory 227 of the computer system 200 and can be accessible and executable by the processor 225.

In some implementations, the set of performance data 145 includes individual data points describing the performance of a virtual vehicle. The individual data points may be timestamped to indicate the performance of the virtual vehicle at one or more times. This beneficially enables the performance of the virtual vehicle to be accessed at different times, under different virtual test environment conditions and responsive to different user inputs. The individual data points included in the set of performance data 145 may be associated with the particular user that provided a user input that the contributed to that data point in the set of performance data. The individual data points included in the set of performance data 145 may also be associated with a data point in the set of test scenario data 146 that indicates the user inputs of the particular user that contributed to that data point in the simulation data. Furthermore, the data point in the set of test scenario data 146 may include test environment data describing conditions present in the virtual test environment for each associated user input. In this way, each data point included in the set of performance data 145 may be associated with a data point in the test scenario data 146 that describes the test environment at the time the particular user provided the one or more user inputs that contributed to that data point in the set of performance data 145.

The determination module 210 may include code and routines configured to analyze the set of performance data 145 and the set of test scenario data 146 (which collectively form the set of vehicle simulation data 147) to identify deficient performance of the virtual vehicle. For example, the determination module 210 may analyze the set of vehicle simulation data 147 to identify instances where a hard constraint was not met. The hard constraint may be defined by a government regulatory agency, a standards setting body, the developer 104 or the manufacturer of the proposed vehicle. The determination module 210 may determine a set of proposed modifications for one or more of the vehicle dynamics model 110 or the control software model 115, where the proposed modifications are configured to correct the deficient performance of the virtual vehicle. For example, the determination module 210 may provide a reachability analysis to identify one or more parameters included in the design of the vehicle that may be modified and what the new values for those identified parameters should be in order to correct the performance of the virtual vehicle. The determination module 210 may provide the new values to one or more of the vehicle model generation application 140A or the control software model generation application 140B to cause the generation of the modified model data 135.

In some implementations, the determination module 210 can be stored in the memory 227 of the computer system 200 and can be accessible and executable by the processor 225.

In some embodiments, the reachability analysis may include analytically dividing the integrated model 250 into a plurality of subsystems. The reachability analysis may include associating one or more guarantees with the different subsystems. The one or more guarantees may include one or more hard constraints that must be satisfied by the subsystem that is associated with the one or more guarantees. The reachability analysis may determine a contract for each subsystem. The contract may include the subsystem satisfying the guarantee for all situations that include the one or more assumptions. The one or more assumptions may include, for example, one or more of the following: the proposed vehicle is being used for its intended purpose; the proposed vehicle is being used in a manner that is compliant with the law; the proposed vehicle is being used in a non-negligent manner; the proposed vehicle is being used in a non-reckless manner, etc. If the contract is not satisfied, then the determination module 210 may determine which of the one or more parameters affected the negative outcome.

The determination module 210 may determine one or more options for modifying the one or more parameters that affected the negative outcome. For example, an option may include a first value for a first parameter may be modified to a second value. The option may include the current values for other parameters being modified to new values. The determination module 210 may repeat this process may a plurality of times for different combinations of parameters that affected the negative outcome to form a set of options for modifying the parameters for the integrated model 250. Each of the options may be configured by the determination module 210 so that their implementation would result in a modified integrated model (as described by the modified model data 135) that would satisfy the one or more guarantees for all situations that include the one or more assumptions (e.g., that the proposed vehicle is used for its intended purpose, that the proposed vehicle is not used in violation of a law, that the proposed vehicle is not negligently used, etc.). The one or more options may be stored in the memory 227 and used to generate a GUI 134 used by the developer 104 to determine one or more options to implement (e.g., graphical element 610 of FIG. 6A). The options may be displayed in the GUI 134 in a ranked order. Implementation of the option may result in modified model data 135 being generated (e.g., element 135 of FIG. 6B) which the developer 104 may the accept or not accept.

The GUI module 212 may include code and routines for generating one or more GUIs 134 based on the GUI data 252. In some implementations, the GUI module 212 can be stored in the memory 227 of the computer system 200 and can be accessible and executable by the processor 225.

FIG. 2B is a block diagram illustrating an example flow process 270 including a simulation system 199 according to some implementations.

In some implementations, the developer 104 provides inputs to the vehicle model generation application 140A, the control software model generation application 140B and the game engine 206.

In some implementations, the vehicle model generation application 140A generates the vehicle dynamics model 110 based at least in part on one or more inputs from the developer 104.

In some implementations, the control software model generation application 140B generates the control software model 115 based at least in part on one or more inputs from the developer 104.

In some implementations, the game engine 206 generates the road model 125 based at least in part on the inputs from the developer 104. The game engine 206 may also generate the road model 125 based on data that describes one or more real world roadway systems.

In some implementations, the vehicle dynamics model 110 and the control software model 115 are inputs to the integration module 204. The integration module 204 may generate the integrated model 250 based on the vehicle dynamics model 110 and the control software model 115.

The road model 125 and the integrated model 250 may be inputs to the game engine 206. The game engine 206 may compile the executable file 130 based at least in part on the road model 125 and the integrated model 250.

Example Methods

Figure 3A:
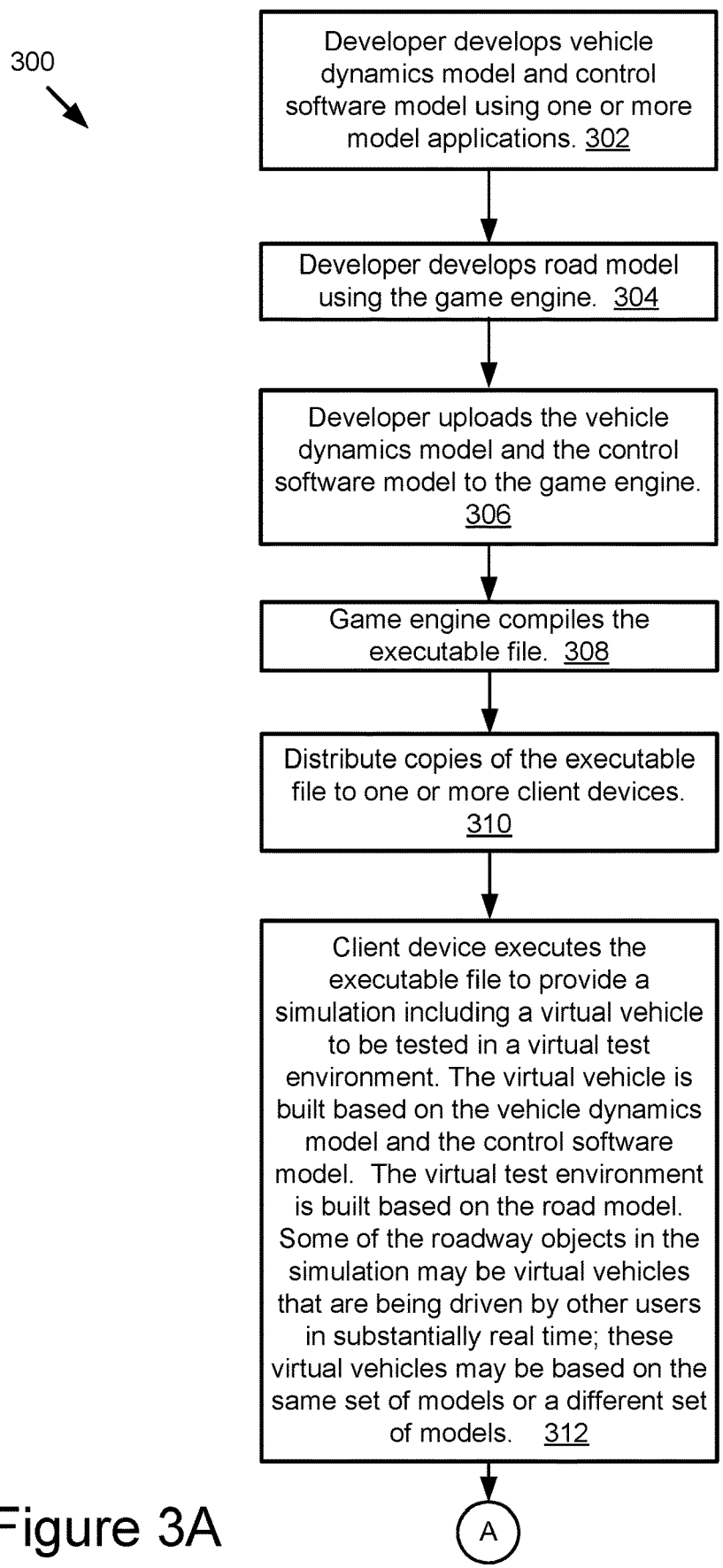
FIGS. 3A and 3B are a flowchart of an example method for generating a graphical user interface for generating modified model data for a proposed vehicle based on a set of vehicle simulation data cloudsourced from a plurality of client devices that simulated the proposed vehicle contemporaneously, according to some implementations.
Figure 3B:
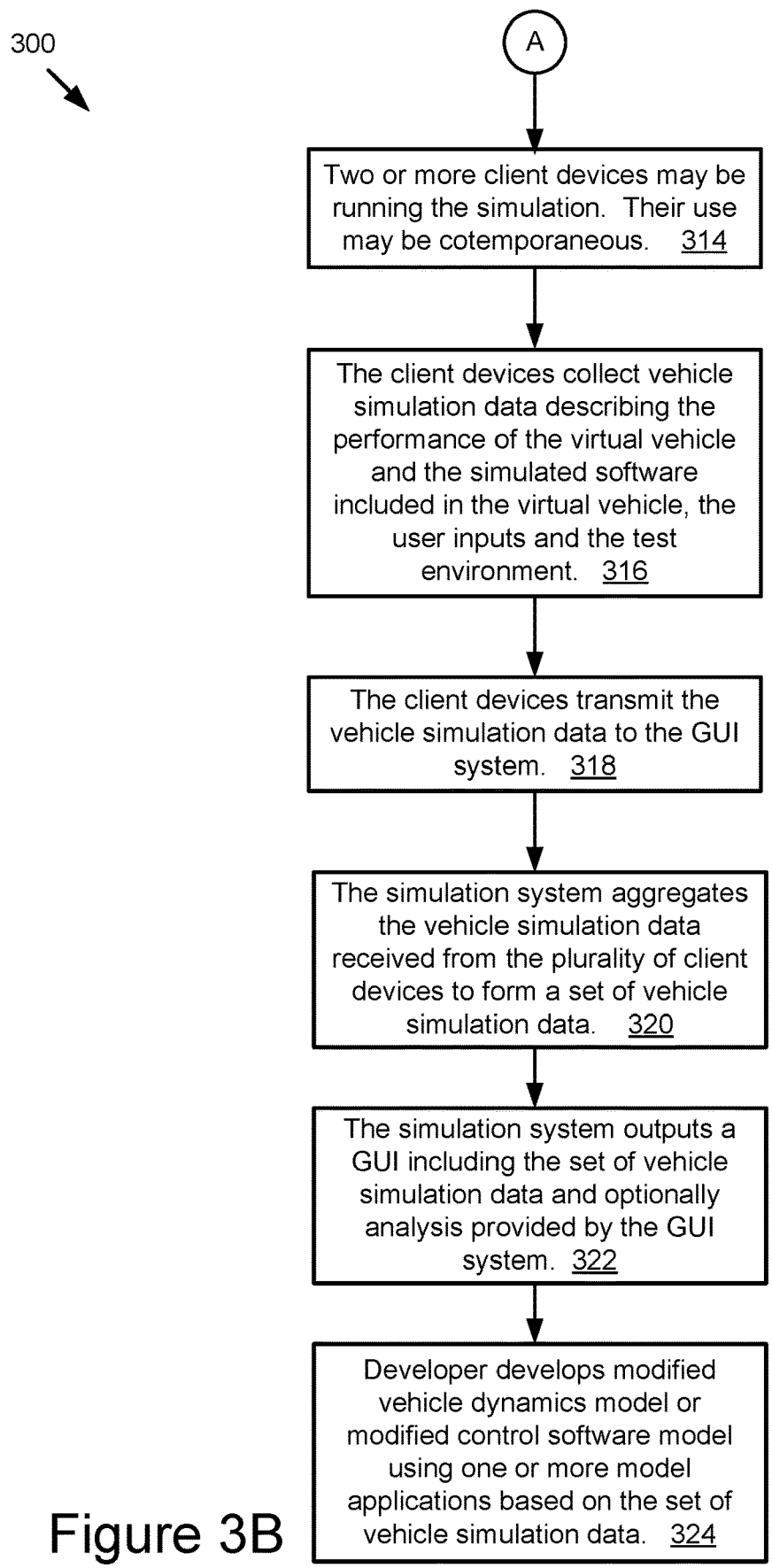

FIGS. 3A and 3B are a flowchart of an example method 300 for generating a GUI for generated modified model data for a proposed vehicle based on a set of vehicle simulation data cloudsourced from a plurality of client devices that simulated the proposed vehicle contemporaneously, according to some implementations.

In some implementations, at step 302 the developer 104 may develop a vehicle dynamics model 110 and a control software model 115 using one or more model generation applications 140. For example, the vehicle model generation application 140A generates the vehicle dynamics model 110 based on inputs from the developer 104. The control software model generation application 140B may generate the control software model 115 based on inputs from the developer 104. The vehicle dynamics model 110 may include portions of a design for the proposed vehicle. The control software model 115 may model ADAS software that is included in the design for the proposed vehicle. The proposed vehicle may include an autonomous or semi-autonomous vehicle.

In some implementations, at step 304 the developer 104 may develop a road model 125 using the game engine 206. For example, the game engine 206 may generate the road model 125 based on inputs from the developer 104. The road model 125 may be configured to generate a virtual test environment for testing the performance of a virtual vehicle that simulates, within the virtual test environment, the proposed vehicle and the control software (e.g., the ADAS software) included in the design for the proposed vehicle. The road model 125 may be based on real world roadway systems. For example, the game engine 206 may be communicatively coupled to a database that includes data describing a set of real world roadway models.

In some implementations, at step 306 the developer 104 may upload the vehicle dynamics model 110 and the control software model 115 to the game engine 206. The game engine 206 may also include the road model 125.

In some implementations, at step 308 the game engine 206 compiles an executable file 130. For example, the game engine 206 compiles an executable file 130 based on the vehicle dynamics model 110, the control software model 115 and the road model 125. The executable file 130 may be configured to be executed by a processor and cause the processor to provide a simulation of the virtual vehicle in the virtual test environment. The processor may be an element of a client 107. A user 103 of the client 107 may drive the virtual vehicle in the virtual test environment. As the user 103 drives the virtual vehicle in the virtual test environment, the executable file 130 (or some other client-side component) may gather vehicle simulation data 163 describing the performance of the virtual vehicle and the control software included in the virtual vehicle.

In some implementations, at step 310 the simulation system 199 distributes copies of the executable file 130 to a plurality of clients 107. The plurality of clients 107 may also be communicatively coupled to the network 105. The simulation system 199 may distribute the copies of the executable file 130 to the plurality of clients 107 via the network 105.

In some implementations, at step 312 the client 107 executes the executable file 130 to provide a simulation including the virtual vehicle to be tested in the virtual test environment. The virtual vehicle is built based on the vehicle dynamics model 110 and the control software model 115. The virtual test environment is built based on the road model 125. The virtual test environment may include roadway objects such as other vehicles, pedestrians, traffic management devices, etc.

Referring now to FIG. 3B. At step 314 some of the roadway objects in the simulation may be virtual vehicles that are being driven by other users of clients 107 in substantially real time; these virtual vehicles may be based on the same set of models or a different set of models. For example, two or more clients 107 included in the plurality of clients 107 may be executing their copies of the executable file 130 contemporaneously. The users 103 of these clients 107 may be driving virtual vehicles on the same roadway in the virtual test environment at the same time.

In some implementations, at step 316 the plurality of clients 107 may collect the vehicle simulation data 163 describing the performance of the virtual vehicle and the simulated software included in the virtual vehicle.

In some implementations, at step 318 the plurality of clients 107 may transmit the vehicle simulation data 163 to the simulation system 199 via the network 105.

In some implementations, at step 320 the simulation system 199 may aggregate the vehicle simulation data 163 received from the plurality of clients 107 to form a set of vehicle simulation data 147.

In some implementations, at step 322 the simulation system 199 may output a GUI 134 including the set of vehicle simulation data 147 (or analytics data describing the vehicle simulation data 147).

In some implementations, at step 324 the developer 104 may develop a modified vehicle dynamics model or a modified control software model using one or more model generation applications 140 based on the set of vehicle simulation data 147.

In some implementations, the proposed vehicle may be manufactured based on one or more of the modified vehicle dynamics model or the modified control software model.

Example Operations

FIGS. 4A and 4B are block diagrams illustrating development device side 410 and client side 415 operations performed when the executable file 130 is executed on the client side 415 according to some implementations. The dashed line going down the middle of FIGS. 4A and 4B represents the network 105.

Referring to FIG. 4A, this block diagram represents an example of the simulation manager 198 acting as a resource to the client 107 by performing some of the operations for the client 107 upon the processor of the client 107 executing the executable file 130. The simulation manager 198 provides a torque input 440, a steering angle input 441 and a GUI data input 442 to the client 107. The client 107 provides wheel RPM data 443, ADAS sensor data 444 and user input and test environment data 445 to the aggregation module 208 of the simulation system 199.

In some embodiments, the vehicle-road interaction data and the test environment data may be examples of the performance data 160.

Referring to FIG. 4B, this block diagram represents an example of the client 107 executing the executable file 130 without relying on the simulation manager. The client 107 provides the vehicle simulation data 163 to the simulation system 199.

Example GUIs

FIGS. 5A and 5B illustrate example GUIs 133 according to some implementations.

Referring to FIG. 5A, depicted is a GUI 133A including a graphical depiction 505 of the virtual vehicle in the virtual test environment and a graphical element 510 displaying vehicle simulation data 163 related to the performance of the virtual vehicle in the virtual test environment.

Referring to FIG. 5B, depicted is a GUI 133B including a graphical depiction of a plurality of virtual vehicles on a roadway at the same time in the virtual test environment. User A, User B and User C may each operation different client devices included in the plurality of clients 107. Two or more of the virtual vehicles may be based on the vehicle dynamics model 110 and the control software model 115 representing the proposed vehicle designed by the developer 104. In other words, at least a subset of the plurality of clients 107 execute the executable file 130 during a same time period, resulting in a plurality of the virtual vehicles being present in the test environment at the same time period. In this way, the plurality of the virtual vehicles may provide vehicle obstacles for one another so that the test environment includes vehicle obstacles without the developer 104 having to hard code vehicle obstacles (e.g., bots representing vehicles on the roadway) into the road model.

The GUI 133B also includes a graphical element 520 displaying vehicle simulation data 163 related to the performance of the virtual vehicle in the virtual test environment.

FIGS. 6A and 6B illustrate example GUIs 134 according to some implementations.

Referring to FIG. 6A, depicted is a GUI 134A including a graphical element 605 depicting an example representation of the analytics data (the text included in the GUI 134A is intended only to be a representative) and another graphical element 610 depicting options for modifying the one or more of the vehicle dynamics model 110 or the control software model 115 for the proposed vehicle based on the analytics data. The developer 104 may select the graphical button 615 to choose to modify one or more of the vehicle dynamics model 110 or the control software model 115 for the proposed vehicle based on the options depicted in graphical element 610.

Referring to FIG. 6B, depicted is a GUI 134B including a graphical element depicting an example of the modified model data 135 (the text included in the GUI 134B is intended only to be a representative). The GUI 134B includes a first graphical button 625 that the developer 104 may select to accept the modified model data 135 and a second graphical button 630 that the developer 104 may select to revert to the previous versions of the vehicle dynamics model 110 or the control software model 115 for the proposed vehicle.

In the above description, for purposes of explanation, numerous specific details are set forth in order to provide a thorough understanding of this disclosure. It will be apparent, however, to one skilled in the art that the disclosure can be practiced without these specific details. In some instances, structures and devices are shown in block diagram form in order to avoid obscuring the description. For example, the present implementations can be described above primarily with reference to user interfaces and particular hardware. However, the present implementations can apply to any type of computing device that can receive data and commands, and any peripheral devices providing services.

Reference in this disclosure to "some implementations" or "some instances" means that a particular feature, structure, or characteristic described in connection with the implementations or instances can be included in at least one implementation of the description. The appearances of the phrase "in some implementations" in various places in this disclosure are not necessarily all referring to the same implementations.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present implementations of this disclosure can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

This disclosure can take the form of some entirely hardware implementations, some entirely software implementations or some implementations containing both hardware and software elements. In some preferred implementations, this disclosure is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device. The computer-readable medium may be a tangible or non-transitory computer-readable storage medium. The computer-readable medium may store computer executable code. The computer-readable medium may be communicatively coupled to a processor. The processor may be programmed to execute one or more portions of the computer-executable code.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited to, keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, this disclosure is not described with reference to any particular programming language. It will be appreciated that a variety of programming languages may be used to implement the teachings of this disclosure as described herein.

The foregoing description of the implementations of this disclosure has been presented for the purposes of illustration and description. It is not intended to be exhaustive or to limit this disclosure to the precise form disclosed. Many modifications and variations are possible in light of the above teaching. It is intended that the scope of the disclosure be limited not by this detailed description, but rather by the claims of this application. As will be understood by those familiar with the art, this disclosure may be embodied in other specific forms without departing from the spirit or essential characteristics thereof. Likewise, the particular naming and division of the modules, routines, features, attributes, methodologies, and other aspects are not mandatory or significant, and the mechanisms that implement this disclosure or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of this disclosure is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to implementation in any specific programming language, or for any specific operating system or environment. Accordingly, the disclosure is intended to be illustrative, but not limiting, of the scope of this disclosure, which is set forth in the following claims.

What is claimed is:

1. A method comprising:
   generating a vehicle dynamics model and a control software model for a proposed vehicle design, wherein the control software model estimates how an Advanced Driver Assistance System (ADAS system) responds to user inputs and a virtual test environment;
   generating a road model for generating the virtual test environment for testing a virtual vehicle simulating the proposed vehicle design, the virtual vehicle being built based on the vehicle dynamics model and the control software model;

compiling an executable file based on the vehicle dynamics model, the control software model and the road model, the executable file configured to be executed by a processor to cause the processor to provide a simulation of the virtual vehicle in the virtual test environment;

distributing, via a network, a plurality of copies of the executable file to a plurality of client devices that are processor-based;

receiving, via the network, a set of vehicle simulation data from the plurality of client devices, wherein the set of vehicle simulation data describes a performance of the virtual vehicle in the virtual test environment over a plurality of miles within the virtual test environment; and determining that the plurality of miles represents a sufficient data set for evaluating the vehicle dynamics model and the control software model based on the plurality of miles exceeding a threshold value.

2. The method of claim 1, wherein the plurality of client devices includes a plurality of different platforms.

3. The method of claim 1, wherein the set of vehicle simulation data includes a set of performance data describing the performance of the virtual vehicle in the virtual test environment and a set of test scenario data describing a set of user inputs that are received while driving the virtual vehicle that contributed to the performance of the virtual vehicle.

4. The method of claim 3, wherein each data point included in the set of performance data describing the performance of the virtual vehicle is (1) timestamped to indicate the performance of the virtual vehicle at one or more times, (2) associated with a particular user that provided a user input that contributed to that data point in the set of performance data, and (3) associated with a data point in the set of test scenario data that indicates the user input of the particular user that contributed to that data point in the set of performance data.

5. The method of claim 4, wherein the set of test scenario data includes virtual test environment data describing conditions present in the virtual test environment for each user input, wherein each data point included in the set of performance data is associated with a data point in the virtual test environment data that describes the virtual test environment at a time the particular user provided the user inputs that contributed to that data point in the set of performance data.

6. The method of claim 1, wherein the plurality of miles represents the sufficient data set if the plurality of miles is greater than or equal to substantially one million kilometers.

7. The method of claim 1, further comprising:
outputting a graphical user interface to a display, wherein the graphical user interface depicts a graphical element to be selected by a user to specify an aspect of the vehicle dynamics model or the control software model to modify.

8. The method of claim 1, wherein the set of vehicle simulation data is received within seven days of distributing the plurality of copies of the executable file to the plurality of client devices.

9. The method of claim 1, wherein the set of vehicle simulation data is received within twenty-four hours of distributing the plurality of copies of the executable file to the plurality of client devices.

10. The method of claim 1, further comprising receiving an input to generate modified model data describing one or more of a modified vehicle dynamics model for the proposed vehicle design or a modified control software model for the proposed vehicle design based at least in part on the set of vehicle simulation data.

11. The method of claim 10, further comprising manufacturing the proposed vehicle design based at least in part on the modified model data.

12. The method of claim 1, further comprising:
analyzing, by a processor, the set of vehicle simulation data to identify deficient performance of the virtual vehicle;

determining, by the processor, a set of proposed modifications for one or more of the vehicle dynamics model or the control software model, wherein the proposed modifications are configured to correct the deficient performance of the virtual vehicle;

receiving an input to select one or more of the proposed modifications; and generating modified model data describing one or more of a modified vehicle dynamics model for the proposed vehicle design or a modified control software model for the proposed vehicle design based at least in part on the input to select one or more of the proposed modifications.

13. The method of claim 11, further comprising manufacturing the proposed vehicle design based at least in part on the modified model data.

14. A non-transitory memory comprising computer code which, when executed by a processor, causes the processor to perform steps comprising:

developing a vehicle dynamics model and a control software model for a proposed vehicle design, wherein the control software model estimates how an Advanced Driver Assistance System (ADAS system) responds to user inputs and a virtual test environment;

developing a road model for generating the virtual test environment for testing a virtual vehicle simulating the proposed vehicle design, the virtual vehicle being built based on the vehicle dynamics model and the control software model;

compiling an executable file based on the vehicle dynamics model, the control software model and the road model, the executable file configured to be executed by a processor to cause the processor to provide a simulation of the virtual vehicle in the virtual test environment;

distributing, via a network, a plurality of copies of the executable file to a plurality of client devices;

receiving, via the network, a set of vehicle simulation data from the plurality of client devices, wherein the set of vehicle simulation data describes a performance of the virtual vehicle in the virtual test environment over a plurality of miles within the virtual test environment; and determining that the plurality of miles represents a sufficient data set for evaluating the vehicle dynamics model and the control software model based on the plurality of miles exceeding a threshold value.

15. The non-transitory memory of claim 14, wherein the road model is built based on a set of real world road data describing roadways that exist in a real world.

16. The non-transitory memory of claim 14, wherein the proposed vehicle design is for an autonomous vehicle or a semi-autonomous vehicle.

17. The non-transitory memory of claim 14, wherein the plurality of client devices includes two to one million client devices and a subset of the client devices executes their copy of the executable file contemporaneously.

18. The non-transitory memory of claim 17, wherein one or more of the plurality of client devices is a smartphone.

19. The non-transitory memory of claim 14, wherein a subset of the plurality of client devices executes the executable file during a same time period, resulting in a plurality of the virtual vehicles being present in the virtual test environment at the same time period.

20. The non-transitory memory of claim 19, wherein the plurality of the virtual vehicles provides vehicle obstacles for one another so that the road model does not include hard coded vehicle obstacles.

21. A system comprising:
a development device;
a plurality of client devices communicatively coupled to the development device via a network;
wherein the development device includes a processor and a graphical user interface system that, responsive to being executed by the processor, causes the processor to:
generate a vehicle dynamics model and a control software model for a proposed vehicle design, wherein the control software model estimates how an Advanced Driver Assistance System (ADAS system) responds to user inputs and a virtual test environment;
generate a road model for providing the virtual test environment for testing a virtual vehicle simulating the proposed vehicle design, the virtual vehicle being built based on the vehicle dynamics model and the control software model;
build an executable file based on the vehicle dynamics model, the control software model and the road model, the executable file configured to be executed by a client-side processor and cause the client-side processor to provide a simulation of the virtual vehicle in the virtual test environment;
distribute, via the network, a plurality of copies of the executable file to the plurality of client devices;
receive, via the network, a set of vehicle simulation data from the plurality of client devices, wherein the set of vehicle simulation data describes a performance of the virtual vehicle in the virtual test environment over a plurality of miles within the virtual test environment; and
determine that the plurality of miles represents a sufficient data set for evaluating the vehicle dynamics model and the control software model based on the plurality of miles exceeding a threshold value.

* * * * *